United States Patent
Sukup et al.

(10) Patent No.: US 7,800,456 B2
(45) Date of Patent: Sep. 21, 2010

(54) METHOD OF FORMING AN OSCILLATOR CIRCUIT AND STRUCTURE THEREFOR

(75) Inventors: Frantisek Sukup, Zasova (CZ); Karel Ptacek, Roznov Pod Radh. (CZ)

(73) Assignee: Semiconductor Components Industries, LLC, Phoenix, AZ (US)

( * ) Notice: Subject to any disclaimer, the term of this patent is extended or adjusted under 35 U.S.C. 154(b) by 299 days.

(21) Appl. No.: 12/126,122

(22) Filed: May 23, 2008

(65) Prior Publication Data

US 2009/0289733 A1 Nov. 26, 2009

(51) Int. Cl.
*H03K 3/02* (2006.01)
(52) U.S. Cl. .................. 331/143; 331/1 A; 331/111; 331/145; 331/149; 331/153; 323/266; 323/271; 323/282; 323/288; 323/265; 323/272; 323/283
(58) Field of Classification Search ............. 331/1 A, 331/111, 143, 145, 149, 153; 323/265, 266, 323/271, 272, 282, 283, 288
See application file for complete search history.

(56) References Cited

U.S. PATENT DOCUMENTS

| 5,142,217 | A | 8/1992 | Gontowski |
| 5,684,684 | A | 11/1997 | Harris et al. |
| 6,771,138 | B1 | 8/2004 | Dumas et al. |
| 7,057,381 | B2 | 6/2006 | Harriman et al. |
| 2008/0054866 | A1* | 3/2008 | Korsunsky ............ 323/272 |
| 2008/0088292 | A1* | 4/2008 | Stoichita et al. ........ 323/285 |

OTHER PUBLICATIONS

Intersil, "ISL8502 2.5A Synchronous Buck Regulator with Integrated MOSFETs", Data Sheet Mar. 7, 2008, FN6389.1, Copyright 2007 Intersil Americas Inc., 18 pages.

* cited by examiner

*Primary Examiner*—Arnold Kinkead
*Assistant Examiner*—Richard Tan
(74) *Attorney, Agent, or Firm*—Robert F. Hightower

(57) ABSTRACT

In one embodiment, an oscillator circuit is configured to oscillate at a base frequency. The oscillator is configured to receive a synchronization signal and restart a period of the oscillator signal responsively to the synchronization signal.

15 Claims, 4 Drawing Sheets

METHOD OF FORMING AN OSCILLATOR CIRCUIT AND STRUCTURE THEREFOR

BACKGROUND OF THE INVENTION

The present invention relates, in general, to electronics, and more particularly, to methods of forming semiconductor devices and structure.

In the past, the electronics industry utilized various techniques to implement distributed systems including multi-phase power systems and particularly power systems that used multiple power supply controllers to control the value of an output voltage. Typically, such multiple power supply controllers each utilized a separate oscillator for controlling each power supply. The power supply systems typically connected the power supply controllers together and synchronized all the oscillators to a frequency of the oscillator of one of the power supply controllers.

One problem with such power supply controllers and power supply systems was the cost of implementing the systems. Typically, the power supply controllers required more than one signal input to control the synchronization of the frequencies of the internal oscillators. Integrating one of these controllers into a single semiconductor die resulted in the synchronization signals requiring more than one pin of the semiconductor package. This caused the controller to use a package that had more pins than was desired thereby increasing the cost of the controller.

Some of the prior controllers required an output pin to drive multiple capacitors in order to perform the synchronization. This caused the circuits to drive large capacitive loads which resulted in more power dissipation and delays in performing the synchronization.

Accordingly, it is desirable to have a power supply controller that can synchronize to externally received frequencies, that does not have jitter in the oscillator frequency, that uses only one package pin for the synchronizing signals, and that has a lower cost.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. It will be appreciated by those skilled in the art that the words during, while, and when as used herein relating to circuit operation are not exact terms that mean an action takes place instantly upon an initiating action but that there may be some small but reasonable delay, such as a propagation delay, between the reaction that is initiated by the initial action. The use of the word approximately or substantially means that a value of an element has a parameter that is expected to be very close to a stated value or position. However, as is well known in the art there are always minor variances that prevent the values or positions from being exactly as stated. It is well established in the art that variances of up to at least ten percent (10%) are reasonable variances from the ideal goal of exactly as described.

DETAILED DESCRIPTION OF THE DRAWINGS

Figure 1:
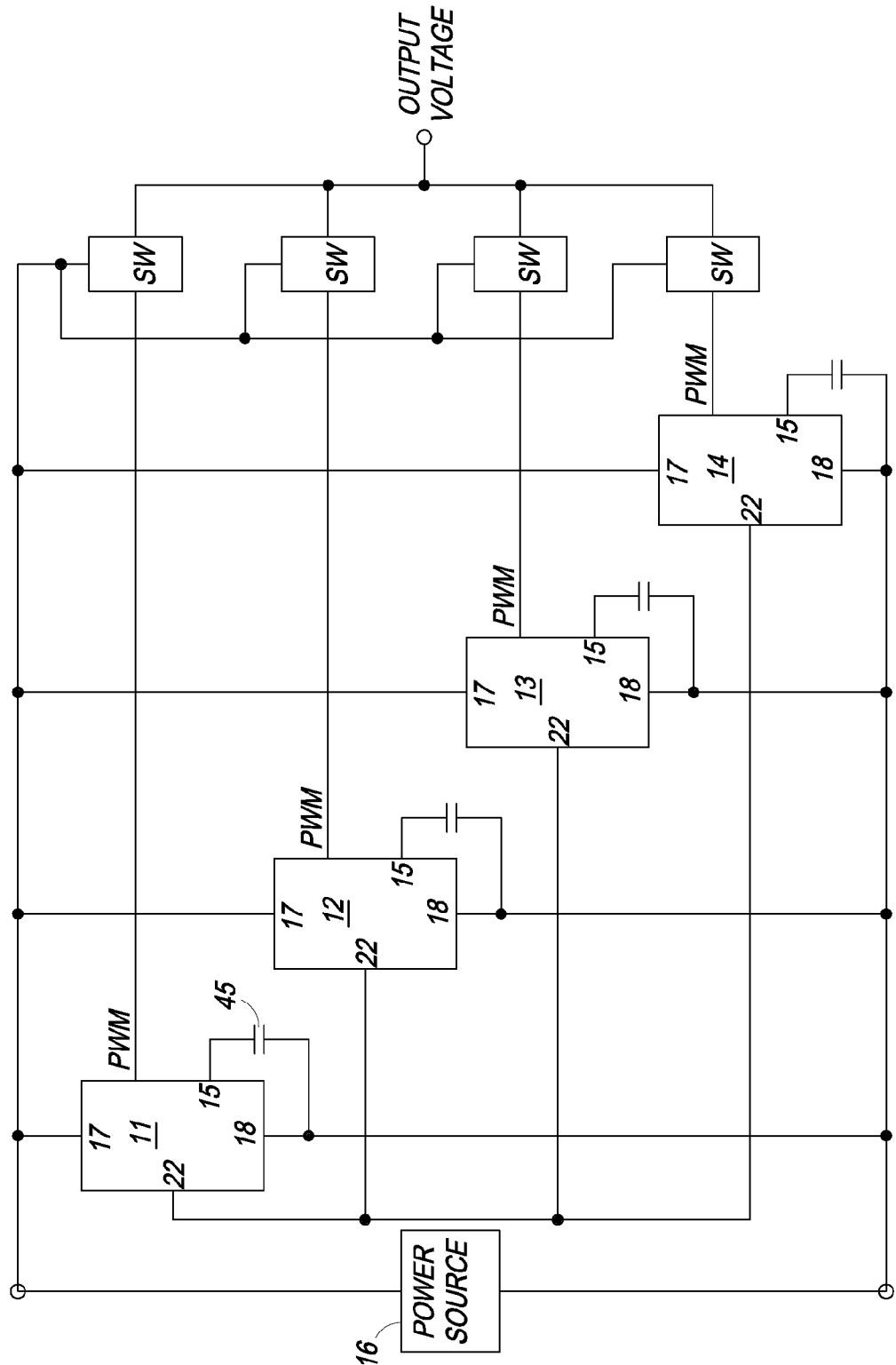
FIG. 1 schematically illustrates an embodiment of a portion of a multi-channel power supply system that includes a plurality of power supply controllers in accordance with the present invention.

FIG. 1 schematically illustrates an embodiment of a portion of a multi-channel switching power supply system 10 that regulates an output voltage to a desired value. System 10 includes a plurality of power supply controllers, illustrated as controllers 11-14, that each form a switching control signal (PWM) that is utilized to assist in regulating the output voltage. Each switching control signal (PWM) drives a switch circuit (SW) that includes a switch, such as a power transistor, and an inductor in order to supply current to an output to regulate the output voltage. Each switch circuit (SW) is illustrated by a box labeled SW. System 10 receives power from a power source 16 that is connected to supply power to the switch circuits, thus, to the output. Those skilled in the art will appreciate that the outputs of the switch circuits (SW) may not all be connected together.

Each of controllers 11-14 includes a synchronization input 22 that is commonly connected to controllers 11-14 to facilitate controllers 11-14 synchronizing the clock signals that are utilized for forming the switching control signals (PWM). Each of controllers 11-14 also include a timing input that is connected to a timing element, such as a capacitor 45.

Figure 2:
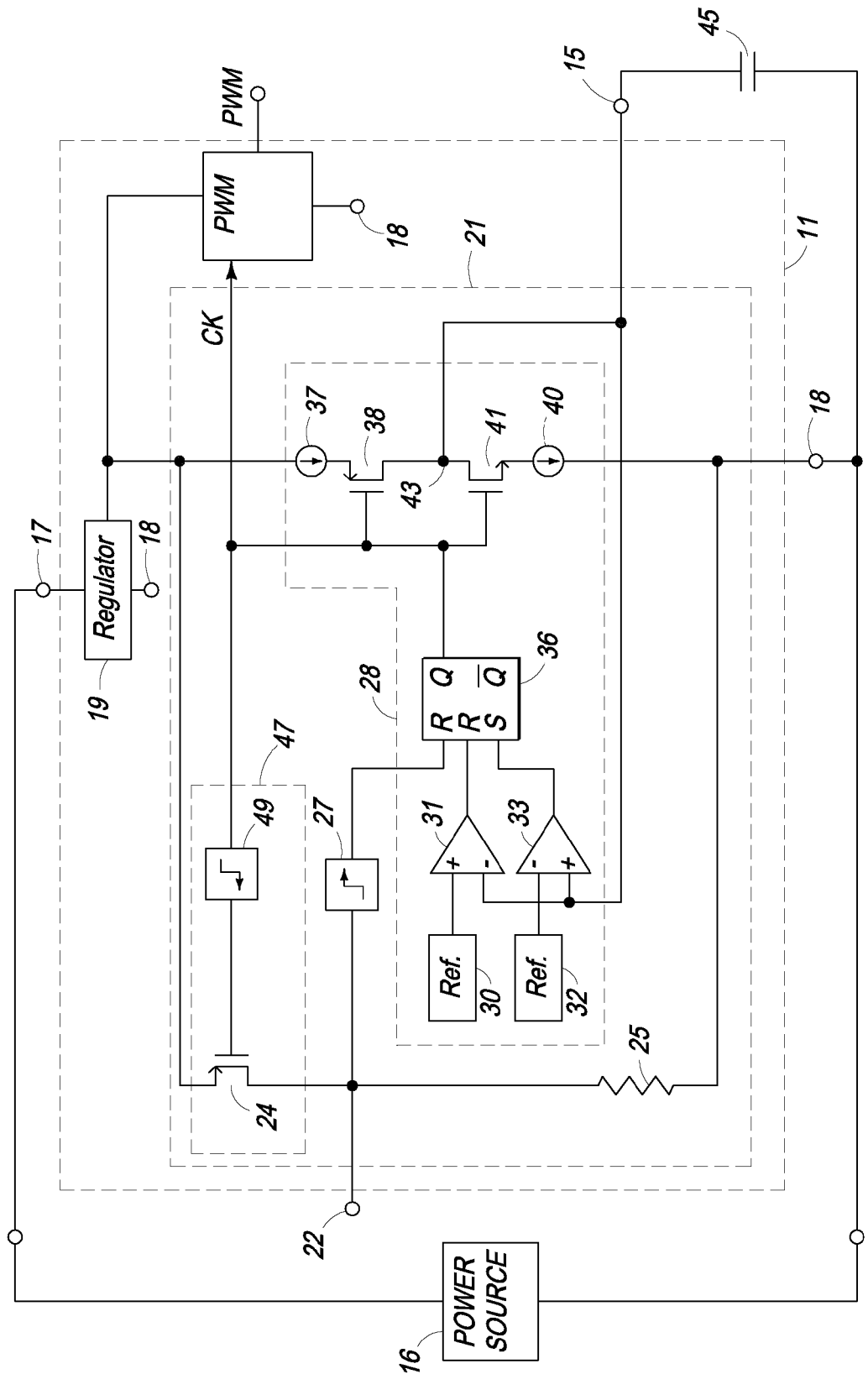
FIG. 2 schematically illustrates an embodiment of a portion of an oscillator circuit of one of the power supply controllers of FIG. 1 in accordance with the present invention.

FIG. 2 schematically illustrates a portion of an exemplary embodiment of power supply controller 11 that was illustrated in FIG. 1. Controller 11 includes a voltage input 17 and a voltage return 18 that are connected to receive power from power source 16. Controller 11 also includes an oscillator circuit 21 that is configured to form a clock (CK) signal and also includes a switching control section (PWM) that receives the clock (CK) signal and responsively forms the switching control signal on output PWM. The switching control section can be any well-known switching control element such as a pulse width modulated (PWM) element, a pulse frequency (PFM) element, or other switching controller. Controller 11 typically includes an internal regulator 19 that is coupled between input 17 and return 18 to receive the input voltage and form an internal operating voltage for operating parts of controller 11.

Circuit 21 is configured to receive a synchronization signal on synchronization input 22 and to also drive input 22 with a synchronization signal formed by oscillator circuit 21. As will be seen further hereinafter, circuit 21 includes an oscillator 28 that is configured to operate at a frequency that is determined by the external timing element, such as capacitor 45, that is coupled to timing input 15. Oscillator 28 forms the clock (CK) signal which also oscillates at the same frequency and has a period during which the clock signal is at a low value during a portion of the period and is at a high value during another portion of the period. Additionally, oscillator 28 is configured to restart the clock signal at the low state responsively to the synchronization signal on input 22 transitioning from a low state to a high state during a portion of the period when the clock signal is high. Oscillator 28 includes a latch 36, and a control circuit that is utilized to control oscillator 28 to oscillate at the frequency. The control circuit includes comparators 31 and 33, a charging current source 37, a charging switch transistor 38, a discharge current source 40, a discharge switch transistor 41, and a signal node 43 where oscillator 28 forms a sawtooth shaped waveform. Current sources 37 and 40 provide substantially equal constant currents so that the period of the clock signal has a substantially fifty percent (50%) duty cycle. Other current values may be used in other embodiments. A reference circuit or ref 30 and a reference circuit or ref 32 assist in controlling latch 36 responsively to the sawtooth waveform in order to form the frequency of the clock signal. As will be seen further hereinafter, charging capacitor 45 establishes a time interval which forms the duration of the low state of the clock signal and discharging capacitor 45 forms another time interval which forms the duration of the high state of the clock signal.

In operation and assuming that latch 36 is reset, the Q output is low which forces the clock signal low. The low from latch 36 also enables transistor 38 and disables transistor 41 thereby allowing current source 37 to charge capacitor 45. Current source 37 charges capacitor 45 until the voltage on node 43 is greater than the value of the reference voltage from Ref 32 at which time the output of comparator 33 is forced high. The high from comparator 33 sets latch 36 thereby forcing the Q output of latch 36 and the clock signal high. Thus, it can be seen that the duration of the clock period when the clock signal is low is formed by the time required to charge capacitor 45. The low to high transition of the clock signal has no effect on edge detector 49 or on the synchronization signal on input 22. The high from latch 36 disables transistor 38 and enables transistor 41 thereby allowing current source 40 to discharge capacitor 45. Current source 40 continues discharging capacitor 45 until the voltage on node 43 decreases to a value that is less than the reference value from ref 30 which forces the output of comparator 31 high. The high from comparator 31 resets latch 36 thereby forcing the clock signal low and again starts the charging cycle of capacitor 45. Thus, it can be seen that the duration of the clock period when the clock signal is high is formed by the time required to discharge capacitor 45. Edge detector 49 detects the high-to-low transition of the clock signal and forms a narrow negative going pulse that enables transistor 24 for the duration of the pulse width. Enabling transistor 24 pulls input 22 high thereby causing oscillator circuit 21 to drive a synchronization signal onto input 22 to other circuits, such as controllers 12-14 that are illustrated in FIG. 1. The positive going pulse on input 22 is detected by edge detector 27 which forms a narrow positive going pulse that is received by latch 36. However, since latch 36 is already reset, the pulse from detector 27 has no effect on latch 36 or on the clock signal. The high going transition of the synchronization signal is detected by other circuits that are connected to input 22, such as controllers 12-14.

During the operation of circuit 21, a circuit that is external to controller 11 may force the synchronization signal on input 22 from a low state to a high state. If latch 36 is reset and the clock signal is low, the externally received synchronization signal has no effect on latch 36 or the clock signal and circuit 21 continues to operate at the frequency determined by current sources 37 and 40 in addition to the value of capacitor 45.

However, if the externally received positive going transition of the synchronization signal occurs while latch 36 is set and the clock signal is high, edge detector 27 detects the positive going synchronization signal and forms a narrow pulse that resets latch 36. Resetting latch 36 forces the clock signal low and enables transistor 38 to begin charging capacitor 45. Additionally, edge detector 49 detects the high to low transition of the clock signal and forms a pulse which temporarily enables transistor 24 to also pull the synchronization input high. However, since latch 36 is already reset, this has no effect on latch 36 or the clock signal. Thus, the externally received synchronization signal restarts the clock signal at a high state and circuit 21 continues to charge capacitor 45 to form the duration of the low state of the clock signal. Additionally, the external circuit that drove the synchronization signal high also has a latch 36 that is reset, thus, the positive going synchronization signal from controller 11 has no effect on that external controller. After capacitor 45 charges to the value of the reference signal from ref 32, comparator 33 sets latch 36 which forces the clock signal high and causes the control circuit to begin discharging capacitor 45. If circuit 21 receives another positive transition of the synchronization signal from external to controller 11, edge detector 27 again resets latch 36 and restarts the clock signal at the low state. Consequently, it can be seen that if synchronization input 22 is driven at a frequency that is slightly higher than the frequency of circuit 21, oscillator circuit 21 adjust the frequency of the clock signal formed by circuit 21 so that the clock signal is substantially identical to the frequency of the signal received on input 22. Additionally, if the frequency of oscillation of circuit 21 is higher than the frequency of controllers 12-14, the oscillator circuit within controllers 12-14 that is substantially identical to circuit 21 synchronizes the respective clock signals to the frequency of the clock signal formed by oscillator circuit 21. Thus, in a system such as system 10, all of controllers 11-14 can be forced to operate at the frequency of the one of controllers 11-14 that operates at the highest frequency. For example, the value of capacitor 45 can be smaller for one of controllers 11-14 to ensure that the controller with the smaller capacitor value oscillates at the highest frequency and the other controllers synchronize the frequency of the corresponding circuits 21 to the higher frequency. Those skilled in the art will appreciate that the frequency established by the control circuit that is utilized to control oscillator 28 can also be set by setting the value of the current provided by sources 37 and 40. For example, a pair of external resistors may be used to set the value of the current provided by sources 37 and 40. The value of the pair of resistors for one of controllers 11-14 may be larger than the pair of resistors for the remained of controllers 11-14 so that the controller may oscillate at a frequency that is higher than the frequency of the remained of the controllers.

Figure 3:
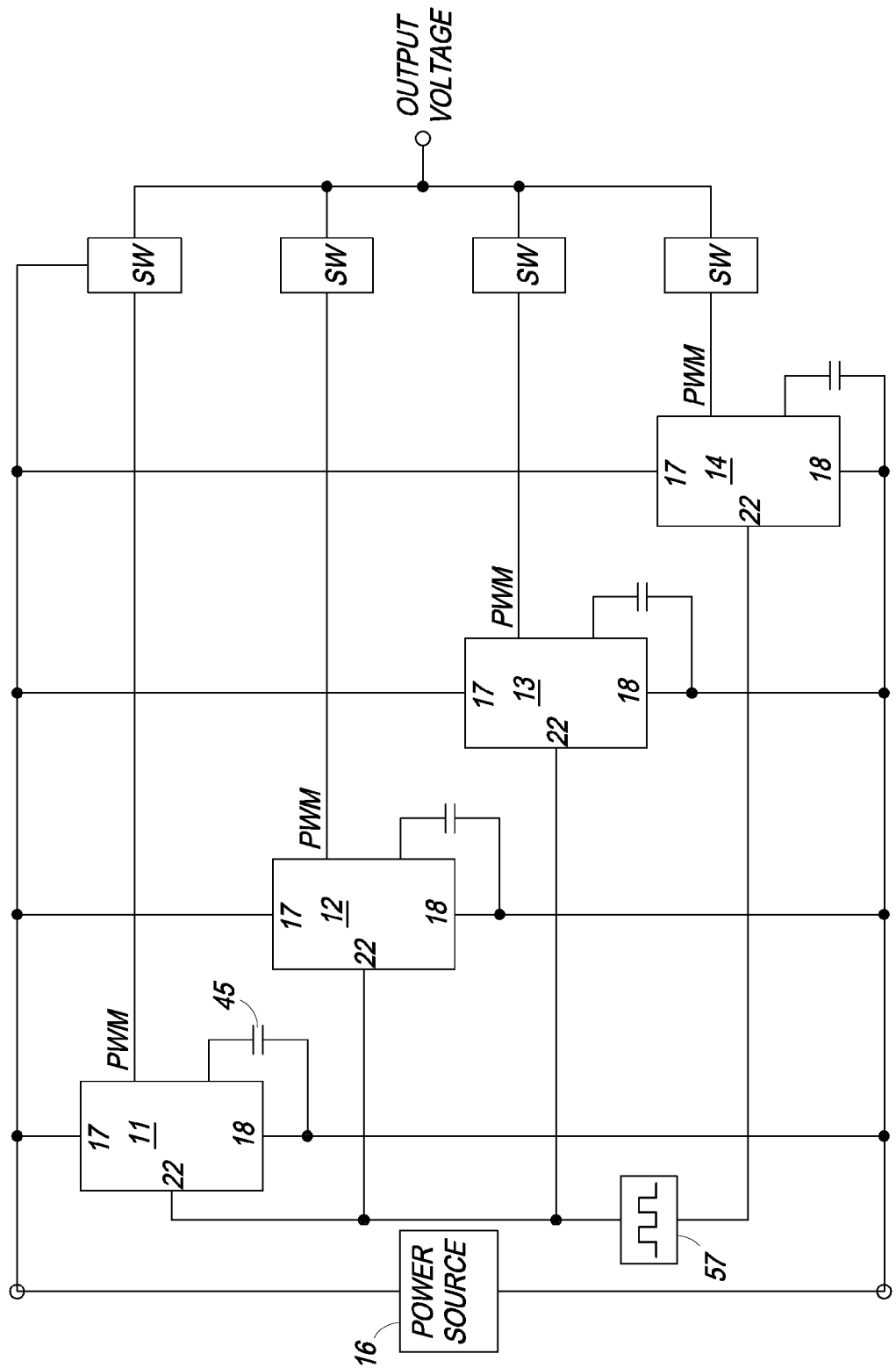
FIG. 3 schematically illustrates an embodiment of a portion of another multi-channel power supply system that includes the plurality of power supply controllers of FIG. 1 in accordance with the present invention.

FIG. 3 schematically illustrates an embodiment of a portion of a multi-channel switching power supply system 55 that is similar to system 10 of FIG. 1. However, system 55 includes an external oscillator circuit 57 that oscillates at a frequency that is higher than any of the frequencies formed by controllers 11-14. Each of controllers 11-14 synchronize the corresponding oscillator circuits to operate at the frequency of circuit 57 as described hereinbefore for circuit 21.

Figure 4:
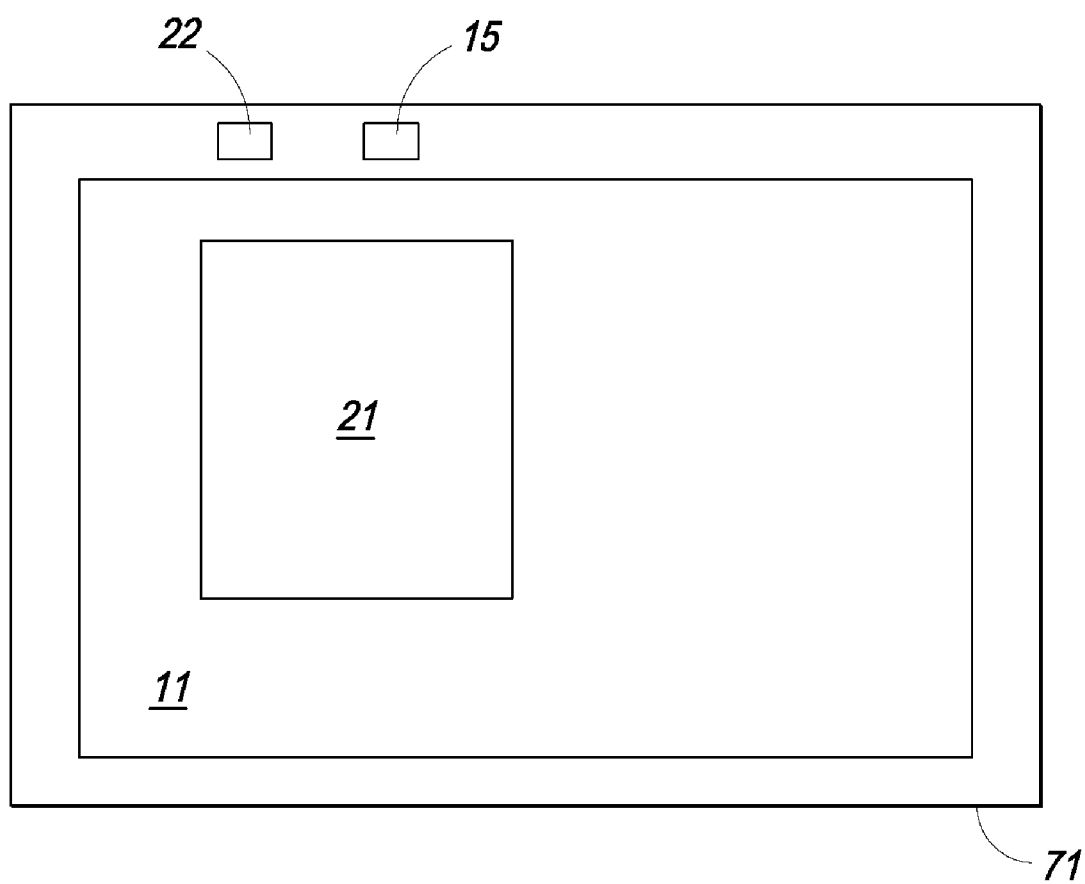
FIG. 4 schematically illustrates an enlarged plan view of a semiconductor device that includes the oscillator circuit of FIG. 2 in accordance with the present invention.

FIG. 4 schematically illustrates an enlarged plan view of a portion of an embodiment of a semiconductor device or integrated circuit 70 that is formed on a semiconductor die 71. Controller 11, including circuit 21, is formed on die 71. Die 71 usually also includes all of the elements of controller 11. Circuit 21 and device or integrated circuit 70 are formed on die 71 by semiconductor manufacturing techniques that are well known to those skilled in the art.

In view of all of the above, it is evident that a novel device and method is disclosed. Included, among other features, is forming an oscillator to oscillate at a frequency and to receive a synchronization signal and restart the oscillator to oscillate at the frequency responsively to the synchronization signal. Only one pin of a semiconductor package is used for the synchronization signal thereby reducing the assembly and packaging costs of the controller.

While the subject matter of the invention is described with specific preferred embodiments, it is evident that many alternatives and variations will be apparent to those skilled in the semiconductor arts. For example, the timing element may be other well-known timing elements in addition to capacitor 45 that is illustrated in FIG. 2. Although the oscillator circuit is explained in the exemplary embodiment of a power supply controller, circuit 21 may be used in a variety of other applications where such an oscillator may be useful. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. An oscillator circuit of a power supply controller comprising:
  a timing input configured to be coupled to a timing element;
  a synchronization input operably coupled to receive a synchronization signal that has a first state and a second state wherein the synchronization input receives the synchronization signal from external to the oscillator circuit;
  a first edge detector operably coupled to receive the synchronization signal and set an output of the first edge detector to a first state of the first edge detector responsively to the synchronization signal changing from the first state of the synchronization signal to the second state of the synchronization signal;
  an oscillator configured to use the timing element to oscillate at a first frequency having a period and to form a clock signal having a first state and a second state during the period, the oscillator configured to restart the clock signal at the first state responsively to the synchronization signal transitioning from the first state of the synchronization signal to the second state of the synchronization signal during an interval where the clock signal is in the second state of the clock signal, and the oscillator configured to not restart the period responsively to the synchronization signal transitioning from the first state of the synchronization signal to the second state of the synchronization signal during an interval where the clock signal is in the first state of the clock signal; and
  an output circuit operably coupled to receive the clock signal and force the synchronization input to the second state of the synchronization signal responsively to the clock signal transitioning from the second state of the clock signal to the first state of the clock signal.

2. The oscillator circuit of claim 1 wherein the output circuit includes a second edge detector coupled to receive the clock signal and an output follower coupled to receive an output of the second edge detector.

3. The oscillator circuit of claim 2 wherein a duration of an output signal of the first edge detector is less than a duration of the first state of the clock signal.

4. The oscillator circuit of claim 1 wherein the oscillator includes a latch operably coupled to a control circuit to form a first duration for the first state of the clock signal and to form a second duration for the second state of the clock signal.

5. The oscillator circuit of claim 4 wherein the control circuit includes a first current source operably coupled to charge a capacitor and form the first duration and a second current source operably coupled to discharge the capacitor and form the second duration.

6. The oscillator circuit of claim 4 wherein the latch has a first reset input coupled to receive the output of the first edge detector and to force the clock signal to the first state responsively to the output of the first edge detector.

7. The oscillator circuit of claim 6 wherein the first edge detector is configured to form a pulse responsively to the synchronization signal transitioning from the first state of the synchronization signal to the second state.

8. The oscillator circuit of claim 7 wherein the output circuit includes a second edge detector configured to form a pulse responsively to the clock signal transitioning from the second state of the clock signal to the first state.

9. The oscillator circuit of claim 8 wherein the output circuit includes an output follower configured to drive the synchronization input responsively to the pulse formed by the second edge detector.

10. A method of forming an oscillator circuit comprising:
  configuring the oscillator circuit to oscillate at a first frequency having a period and to form a clock signal having first and second states during the period wherein the oscillator circuit is configured to be coupled to a timing element on a timing input and form the first frequency responsively to the timing element;
  forming the oscillator circuit to receive a synchronization signal from external to the oscillator circuit wherein the synchronization signal has a first state and a second state wherein the synchronization signal is received on a synchronization input of the oscillator circuit;
  configuring the oscillator circuit to restart the clock signal at the first state and to form the period at the first frequency responsively to the synchronization signal transitioning from the first state of the synchronization signal to the second state of the synchronization signal during an interval where the clock signal is in the second state of the clock signal; and
  configuring the oscillator circuit to drive the synchronization input to the second state of the synchronization signal responsively to the clock signal transitioning from the second state of the period to the first state of the period.

11. The method of claim 10 wherein configuring the oscillator circuit to drive the synchronization input to the second state of the synchronization signal responsively to the clock signal has no effect on the clock signal.

12. The method of claim 10 wherein configuring the oscillator circuit to restart the clock signal at the first state includes configuring the oscillator circuit to not restart the clock signal responsively to the synchronization signal transitioning from the first state of the synchronization signal to the second state of the synchronization signal during an interval where the clock signal is in the first state of the clock signal.

13. The method of claim 10 wherein configuring the oscillator circuit to oscillate at the first frequency having the period includes coupling a latch to cause a control circuit to form a first time duration for the first state of the clock signal and to form a second time duration for the second state of the clock signal.

14. The method of claim 13 wherein forming the oscillator circuit to receive the synchronization signal includes operably coupling a positive edge detector to receive the synchronization signal and form an output having an active state representing a transition of the synchronization signal from the first state to the second state.

15. The method of claim 14 wherein operably coupling the positive edge detector includes coupling an output of the positive edge detector to reset the latch to cause the oscillator circuit to restart the clock signal at the first state.

* * * * *